United States Patent [19]
Yamada

[11] Patent Number: 5,981,391
[45] Date of Patent: Nov. 9, 1999

[54] FABRICATION PROCESS OF A SEMICONDUCTOR DEVICE INCLUDING GRINDING OF A SEMICONDUCTOR WAFER

[75] Inventor: Yutaka Yamada, Kawasaki, Japan

[73] Assignee: Fujitsu Limited, Kanagawa, Japan

[21] Appl. No.: 08/805,753

[22] Filed: Feb. 25, 1997

[30] Foreign Application Priority Data

Sep. 30, 1996 [JP] Japan ................................. 8-259873

[51] Int. Cl.⁶ .................................................. H01L 21/304
[52] U.S. Cl. ............................ 438/690; 428/68; 438/459; 438/460; 438/465; 438/758; 438/759; 438/906; 438/974; 438/977
[58] Field of Search .................................. 438/977, 974, 438/465, 460, 906, 459, 690, 758, 759

[56] References Cited

U.S. PATENT DOCUMENTS 5,344,524 9/1994 Sharma .................................. 156/630

FOREIGN PATENT DOCUMENTS 7-105367 11/1995 Japan .

*Primary Examiner*—Nasser Ahmad
*Attorney, Agent, or Firm*—Armstrong, Westerman, Hattori, McLeland & Naughton

[57] ABSTRACT

A method of fabricating a semiconductor device includes the steps of protecting a front surface of a semiconductor substrate by an adhesive medium, grinding a rear surface of the semiconductor substrate in a state that the front surface is protected by the adhesive medium, removing the adhesive medium from the rear surface, and heating the semiconductor substrate, after the step of removing, to a temperature higher than a thermal decomposition temperature of an adhesive provided on the adhesive medium.

6 Claims, 7 Drawing Sheets

FABRICATION PROCESS OF A SEMICONDUCTOR DEVICE INCLUDING GRINDING OF A SEMICONDUCTOR WAFER

BACKGROUND OF THE INVENTION

The present invention generally relates to fabrication of semiconductor devices and more particularly to a fabrication process of a semiconductor device including a grinding step applied to a rear surface of a semiconductor substrate while protecting a front side thereof by an adhesive medium.

In the fabrication process of semiconductor devices such as a semiconductor integrated circuit on a semiconductor wafer, it is commonly practiced to divide the semiconductor wafer into individual chips by a dicing process.

Before applying such a dicing process, it is generally necessary to grind a rear surface of the wafer opposite to a front surface where the semiconductor devices are formed, such that the wafer has a predetermined thickness. For example, such a grinding process is used to reduce the thickness of a wafer of six-inch diameter from 720 $\mu$m to 500 $\mu$m or less according to the specification of the semiconductor device.

In order to prevent damaging of the semiconductor wafer such as cracking at the time of the grinding, it is commonly practiced to protect the front surface of the wafer, where the semiconductor devices are formed as noted already, by an adhesive medium such as an adhesive tape. Generally, the adhesive tape used for such a purpose carries, on a tape base, an adhesive layer of an acrylic resin with a thickness of 30–40 $\mu$m. The tape base, in turn, is formed of a polymer such as polyolefin or polyethylene and generally has a thickness of 100–150 $\mu$m. Further, a polymer material such as polyvinyl chloride is also used for the tape base.

After the grinding process, the adhesive tape is removed. In order to facilitate the removal of the tape without leaving any adhesive material on the wafer, the adhesive layer used for such a purpose is generally added with a surfactant. By doing so, the remaining adhesives on the substrate can be removed completely by cleaning the wafer in a purified water or in an organic solvent, if necessary.

Further, there is a proposal to use an adhesive tape that carries an UV-cure type adhesive on the tape base for the purpose of the protection of the wafer during the grinding process. When using such a UV-cure type tape, an ultraviolet radiation is applied to the wafer covered by the tape before removing the tape from the wafer for facilitating the removal of the tape. As the adhesive is cured as a result of the ultraviolet radiation, the adhesion of the tape to the wafer is reduced substantially and the removal of the tape is achieved easily, without applying excessive stress to the wafer.

However, the use of such a conventional tape that contains a surfactant in the adhesive is disadvantageous in that a cleaning process is necessary and inevitable after the removal of the tape, wherein the cleaning process may have to be continued for at least 15–60 minutes. In relation to the removal of the adhesive, it should be noted that the composition of the adhesives used in such a tape changes substantially lot by lot, and the adhesive of the tape tends to establish a very intimate adhesion with the wafer surface particularly when materials such as amorphous carbon, nitrides or amorphous polyimides are remaining on the wafer surface. Such a strong adhesion suggests that there is a crosslink reaction between the adhesive and the residual materials on the wafer. A similar problem occurs also in the tape carrying the UV-cure type adhesives.

Thus, it has been necessary to carry out the cleaning of the substrate surface for a prolonged time duration. As the surface of the wafer is generally protected by a film such as a PSG (phosphosilicate glass), a polyimide or SiN, the tape adhesive remaining on the wafer surface after the tape removal, raises a serious problem.

In order to avoid the problem and to eliminate the cleaning process, it is possible to apply an ozone ashing process for a limited time interval against the wafer surface after the removal of the tape, such that the remaining organic materials are oxidized. However, such an ozone ashing process requires a huge investment for the facility and the cost of the produced semiconductor device is increased inevitably. It is also possible to apply a post-treatment process by using an organic solvent such as isopropyl alcohol for removing the remaining adhesives. However, such a post-treatment process inevitably lowers the through-put of production of the semiconductor device.

Further, the use of a UV-cure tape in the grinding process may cause a problem in the fabrication of a semiconductor memory device that includes a so-called floating gate, such as a flash memory or EEPROM. More specifically, the initial data written into the floating gate of the device may be erased or modified as a result of the ultraviolet radiation.

For example, the data written into the floating gate of a flash memory is destroyed when an ultraviolet radiation is applied to the substrate with a wavelength of 253.7 nm and a radiation flux or dose of 1500 mW/cm$^2$. When a ultraviolet radiation of a 365 nm wavelength is used, the destruction of the data occurs when the radiation dose is 400 mW/cm$^2$.

The foregoing problem of destruction of the data as a result of the ultraviolet radiation may be avoided by covering the substrate surface by a polyimide film. However, such a process again requires a huge investment and increases the cost of the semiconductor device. Because of this reason, the use of the UV-cure protective tape has not been made as a matter of common practice for fabricating low cost semiconductor devices.

SUMMARY OF THE INVENTION

Accordingly, it is a general object of the present invention to provide a novel and useful semiconductor device and a fabrication process thereof wherein the foregoing problems are eliminated.

Another and more specific object of the present invention is to provide a fabrication process of a semiconductor device including a step of grinding a rear surface of a semiconductor wafer while protecting a front surface thereof, on which the semiconductor device is formed, by an adhesive tape, wherein the duration of a cleaning process conducted on the semiconductor wafer after the removal of the adhesive tape for eliminating an adhesive remaining on the wafer, is substantially reduced.

Another object of the present invention is to provide a method of fabricating a semiconductor device, comprising the steps of:

protecting a front surface of a semiconductor substrate by an adhesive medium;

grinding a rear surface of said semiconductor substrate in a state that said front surface is protected by said adhesive medium;

removing said adhesive medium from said front surface; and heating said semiconductor substrate, after said step of removing, to a temperature higher than a thermal decomposition temperature of an adhesive provided on said adhesive medium.

According to the present invention, an organic material remaining on the semiconductor substrate as a residue of the adhesive is removed easily in a short time, without cleaning the semiconductor substrate in a purified wafer or in an organic solvent for a long time, by merely decomposing the remaining organic material by way of thermal annealing.

Another object of the present invention is to provide a fabrication process of a semiconductor device including a step of grinding a rear surface of a semiconductor wafer while protecting a front surface thereof, on which the semiconductor device is formed, by an adhesive medium carrying an ultraviolet-cure type adhesive layer thereon, wherein the fabrication process includes a step of curing the adhesive layer, in the state that the adhesive medium is applied to the front surface of the semiconductor wafer, by applying a ultraviolet radiation to the adhesive layer without modifying an electronic state of the semiconductor device substantially, the curing step including the steps of forming an ultraviolet cut-off filter in the adhesive layer and applying the ultraviolet radiation to the adhesive layer through the ultraviolet cut-off filter thus formed.

Another object of the present invention is to provide a method of fabricating a semiconductor device, comprising the steps of:

protecting a front surface of a semiconductor substrate by an adhesive medium carrying a ultraviolet-cure adhesive layer;

grinding a rear surface of said semiconductor substrate in a state that said front surface is protected by said adhesive medium;

partially curing said ultraviolet-cure adhesive layer to form a ultraviolet-cut filter in said ultraviolet-cure adhesive layer;

curing said ultraviolet-cure adhesive layer by exposing said ultraviolet-cure adhesive layer, after said ultraviolet-cure adhesive layer is partially cured, to an ultraviolet radiation; and removing said adhesive medium from said front surface.

Another object of the present invention is to provide a semiconductor device including a semiconductor wafer carrying a semiconductor device on a surface thereof and an adhesive medium provided on the semiconductor wafer so as to cover the foregoing surface, the adhesive medium carrying an ultraviolet-cure type adhesive layer thereon, wherein the ultraviolet-cure type adhesive layer includes a ultraviolet filter that substantially cuts an ultraviolet radiation.

Another object of the present invention is to provide a semiconductor device, comprising:

a substrate;

a semiconductor device provided on a surface of said substrate;

an ultraviolet-cure adhesive layer provided on said substrate so as to cover said semiconductor device; and a medium provided on said ultraviolet-cure adhesive layer;

said ultraviolet-cure adhesive layer having a transmission spectrum that cuts off an ultraviolet radiation substantially.

According to the present invention, it is possible to remove the adhesive medium from the semiconductor substrate without applying an excessive stress or damage thereto. As a result of the partial curing, the adhesive layer includes an ultraviolet cut-off filter. Thus, the ultraviolet excitation of carries in the semiconductor device is reduced substantially, and the destruction of information written into a floating gate as in the case of a flash memory or EEPROM is successfully eliminated.

Other objects and further features of the present invention will become apparent from the following detailed description when read in conjunction with the attached drawings.

DETAILED DESCRIPTION OF THE PREFERRED EMBODIMENTS

First, the principle of the present invention will be described.

In the present invention, a rear surface of a semiconductor wafer is ground in a state that a front surface thereof is protected by an adhesive tape as practiced conventionally, wherein the semiconductor substrate is, after the adhesive tape is removed from the front surface thereof, subjected to a thermal annealing process conducted at a temperature exceeding a thermal decomposition temperature of an adhesive forming an adhesive layer of the tape. The annealing process is preferably conducted in an inert gas atmosphere such as a nitrogen gas atmosphere, while it is also possible to carry out the thermal annealing process in a oxidizing atmosphere.

The thermal annealing process is continued for a very short time, typically about 10 seconds, while this is a remarkable reduction of the process time as compared with the conventional cleaning process, which is typically conducted in a purified water for more than 15 minutes.

It is preferable to set the temperature of the thermal annealing process to be 350° C. or less such that the semiconductor devices formed in the substrate experiences no substantial deterioration or degradation. When the semiconductor device uses Al for the electrode or a polyimide film for an insulation or protection film, the degradation becomes conspicuous when the thermal annealing temperature exceeds 350° C.

In another aspect, the present invention applies a grinding process to a rear surface of a semiconductor wafer while protecting a front surface by an adhesive tape carrying a UV-cure type adhesive layer, wherein the adhesive layer is partially cured before the removal of the adhesive tape to form a UV-cut filter in the adhesive layer. By exposing the adhesive layer to an ultraviolet radiation via the UV-cut filter thus formed in the adhesive layer, it is possible to cure the adhesive layer without destroying the information written into a floating gate of a flash memory or EEPROM in the form of electric charges. As the adhesive layer is cured, the tape can be peeled off easily from the front surface of the wafer without applying an excessive stress to the wafer or the semiconductor device formed in the wafer.

Figure 1:
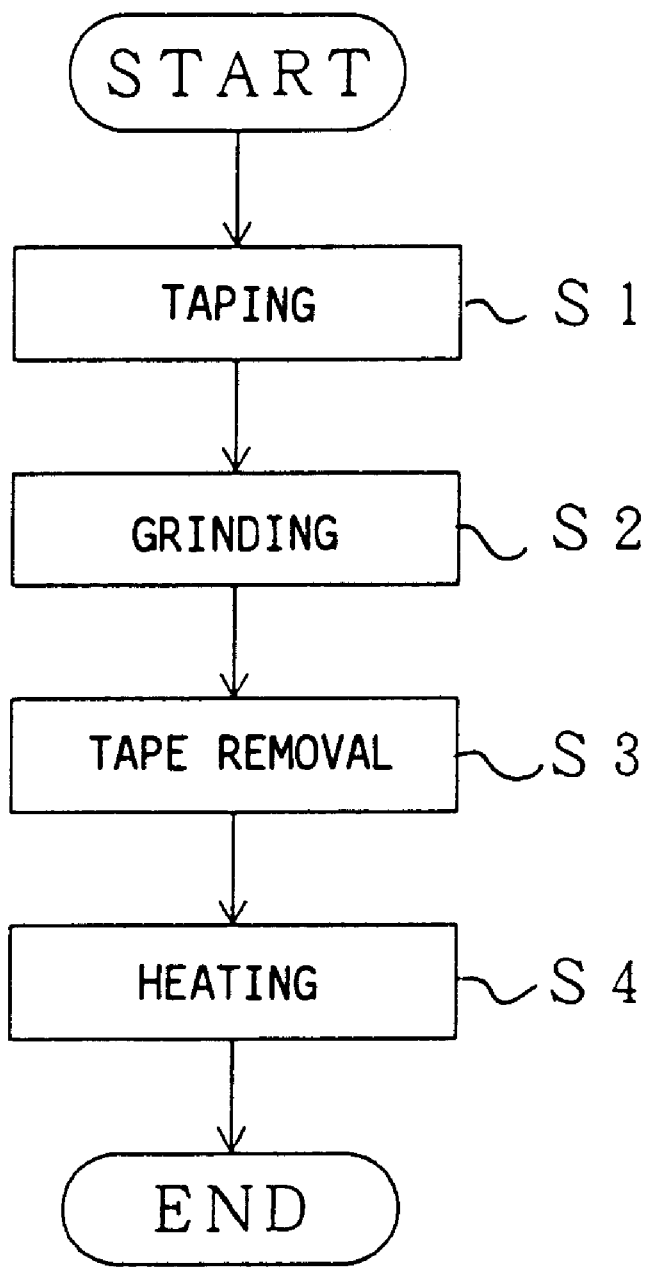
FIG. 1 is a flowchart showing the fabrication process of a semiconductor device according to a first embodiment of the present invention.

FIG. 1 is a flowchart showing a fabrication process of a semiconductor device according to a first embodiment of the present invention, while FIGS. 2–5 show the steps shown in the flowchart of FIG. 1.

Figure 2:
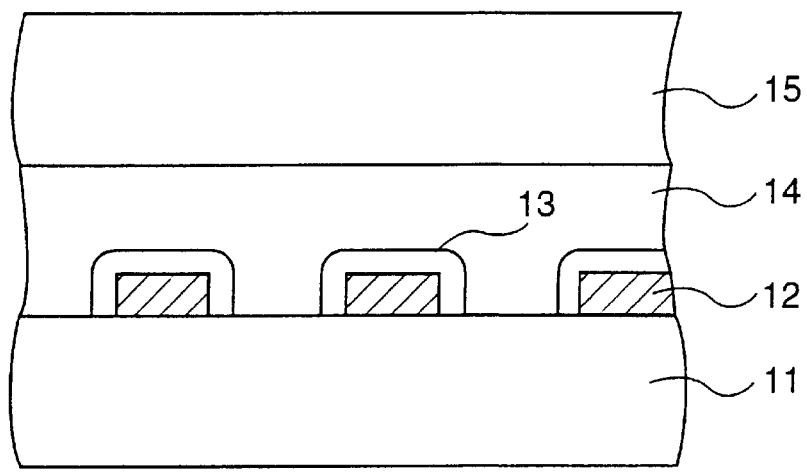
FIG. 2 is a diagram showing the semiconductor device in a step of the fabrication process of FIG. 1.

Referring to FIGS. 1 and 2, a protective tape 15 carrying an adhesive layer is attached in a step S1 to a top surface of a substrate 11, which may be a semiconductor wafer such as a Si wafer. The substrate 11 may have an initial thickness of about 720 $\mu$m and carries various patterns 12 on the top surface thereof, wherein the pattern 12 includes an electrode or an interconnection pattern formed typically of a low melting metal or alloy such as Al or a refractory metal such as W or Mo. Further, the patterns 12 may include a nitride of a refractory metal or a polysilicon.

The substrate 11 may further include various diffusion regions not illustrated. Each of the foregoing patterns 12 is covered by an insulation film 13 typically formed of $SiO_2$, a PSG, a polyimide or SiN. Further, a number of chip regions, each having a size of 60–150 $\mu$m for each edge, are defined on the substrate surface with a separation from each other by scribe lines.

The adhesive layer 14 of the tape 15 is typically formed of an acrylic adhesive and decomposes at a temperature of about 200° C. The tape 15 itself is formed of a polyolefin compound or a polyethylene compound and has a thickness of 100–150 $\mu$m. It is also possible to use polyvinyl chloride for the tape 15. The adhesive layer has a thickness of typically 30–40 $\mu$m.

Figure 3:
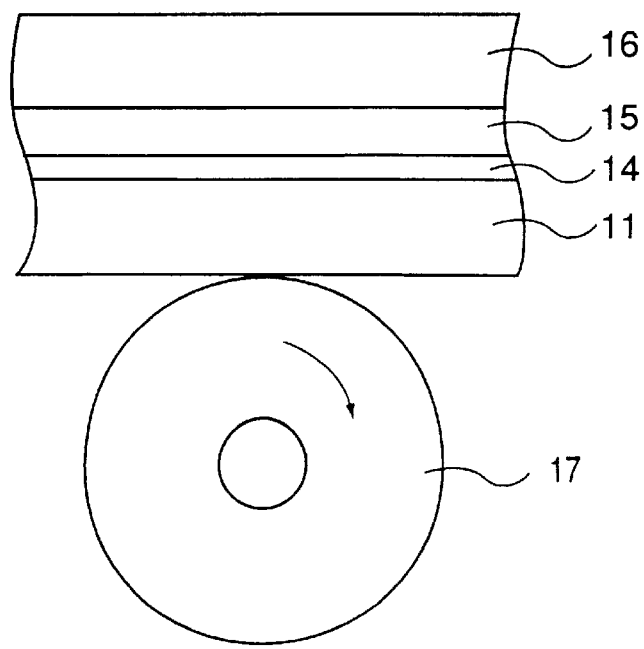
FIG. 3 is a diagram showing the semiconductor device in another step of the fabrication process of FIG. 1.

Next, in a step S2 of FIG. 1, the substrate 11 is held by a vacuum chuck mechanism 16 by causing the vacuum chuck mechanism 16 to engage with the tape 15 as indicated in FIG. 3. In this state, the substrate 11 is contacted with a grinding wheel 17 as indicated in FIG. 3 such that the grinding wheel 17 grinds away the rear surface of the substrate 11. As a result of the grinding thus conducted, the thickness of the substrate 11 is reduced to 500 $\mu$m or less. As the substrate 11 is protected by the tape 15 in the state of FIG. 3, the problem of damaging of the substrate 11 is effectively avoided even when the rotating grinding wheel 17 is applied to the substrate 11.

Figure 4:
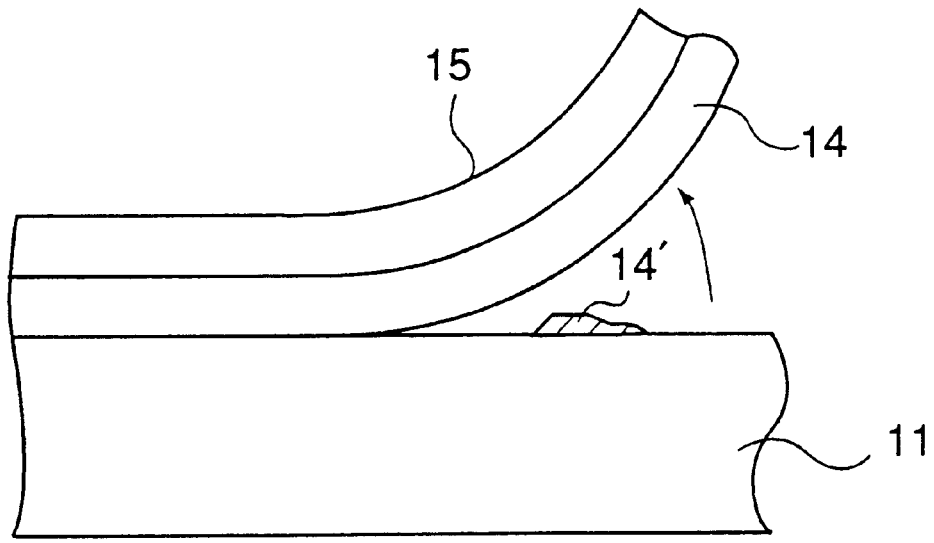
FIG. 4 is a diagram showing the semiconductor device in a further step of the fabrication process of FIG. 1.
Figure 5:
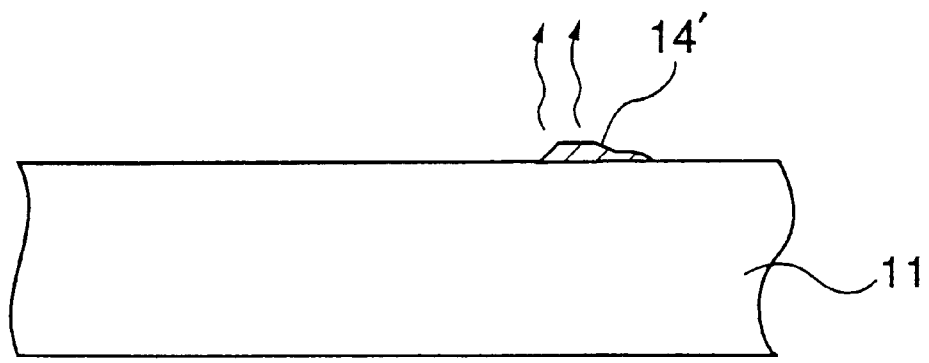
FIG. 5 is a diagram showing the semiconductor device in a still further step of the fabrication process of FIG. 1.

Next, in the step S3 of FIG. 1, the substrate 11 is released from the vacuum chuck 16, and the tape 15 is peeled off from the substrate 11 together with the adhesive layer 14 as indicated in FIG. 4, by applying a powerful adhesion tape (not shown) having a strong adhesion force of 200 g/cm for example on the tape 15 and by pulling the adhesion tape thus attached. In FIG. 4, it should be noted that the illustration of the pattern 12 and the protective film 13 is omitted for the sake of simplicity.

In the conventional process, it has been necessary to carry out a prolonged cleaning process in order to remove any residual adhesives 14' remaining on the front surface of the substrate 11 in a purified water or in an organic solvent. As noted already, such residual adhesives 14' establish a firm adhesion particularly with amorphous C of SiN or an amorphous polyimide remaining on the surface of the substrate 11 such as the surface of the protective film.

Thus, the present invention uses a step S4 in the process of FIG. 1 for heating the substrate 11 to a temperature above the thermal decomposition temperature of the adhesive layer 14. Such a heating may be achieved for example by passing the substrate 11 through an electric furnace set to the foregoing temperature exceeding the thermal decomposition temperature. Thereby, the remaining adhesives 14' are decomposed or vaporized.

It should be noted that the temperature of the furnace is preferably set not exceeding 350° C. in order to avoid the degradation of the electrode or conductor pattern 12 or the degradation of the protective layer 13, particularly in the case in which the electrode or conductor pattern 12 is formed of Al or in the case in which the protective layer 13 is formed of a polyimide. Further, in order to avoid oxidation of Al used for the electrode or conductor pattern 12, it is preferable to carry out the foregoing thermal annealing process in the furnace by forming therein an inert atmosphere such as a nitrogen atmosphere or an argon atmosphere. Typically, a duration of less than one minute is sufficient for such an annealing process for causing the thermal decomposition of the remaining adhesives 14'. This is a remarkable reduction of time as compared with the conventional process in which a cleaning has to be continued in a purified water for 15–60 minutes or more.

When Au or other chemically stable metal is used for the pattern 12, it is possible to carry out the thermal annealing process in an oxidizing atmosphere. Even in such a case, it is not necessary to use an expensive apparatus such as an ozone ashing apparatus, and the fabrication cost of the semiconductor device can be reduced significantly.

Figure 6:
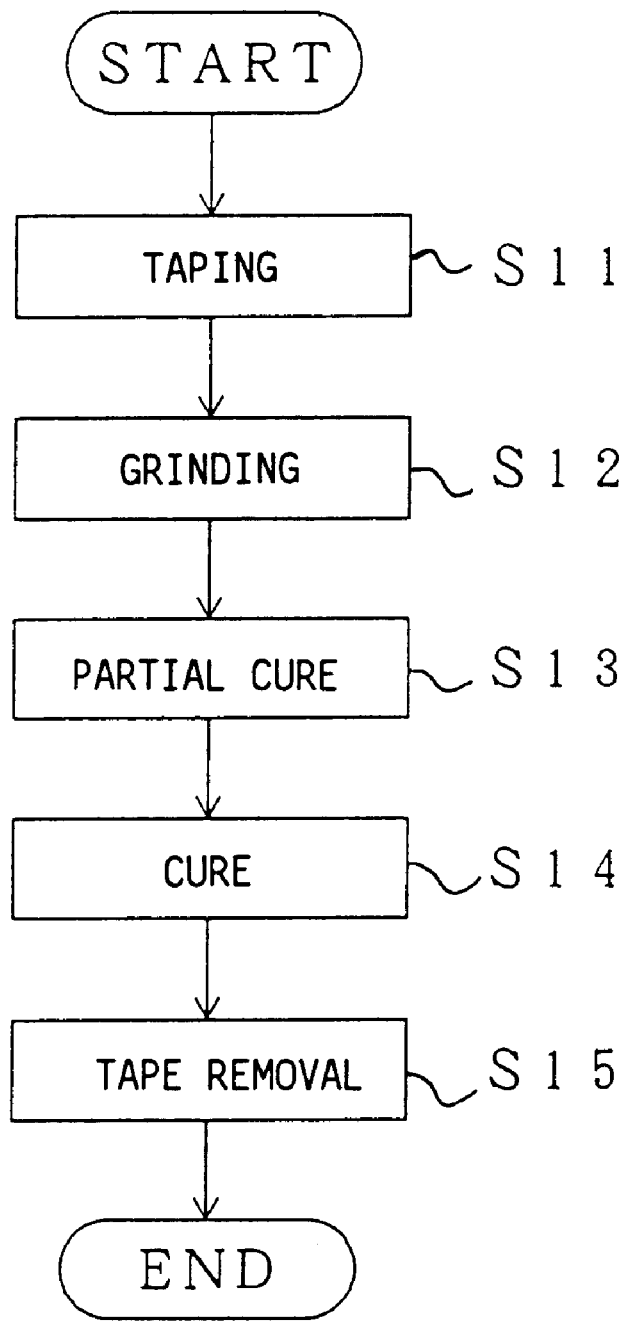
FIG. 6 is a diagram showing the fabrication process of a semiconductor device according to a second embodiment of the present invention.

FIG. 6 is a flowchart showing the fabrication process of a semiconductor device according to a second embodiment of the present invention, wherein those parts described previously are designated by the same reference numerals and the description thereof will be omitted. It should be noted that the present embodiment is particularly useful for the case in which the semiconductor substrate 11 carries thereon a non-volatile semiconductor memory device such as a flash memory or an EEPROM that includes a floating gate or a semiconductor device that changes an operational characteristic thereof in response to an ultraviolet radiation.

Referring to FIG. 6, the semiconductor substrate 11 is covered, at a top surface thereof, with the protective tape 15 in a step S11 corresponding to the step S1 of FIG. 1, wherein the tape 15 carries the adhesive layer 14 formed of a UV-cure adhesive. Further, the substrate 11 carries, on the foregoing top surface, a flash memory or an EEPROM indicated in FIG. 7. For the adhesive layer 14, it is possible to use an acrylic adhesive such as 2-ethylhexyl acrylate, and the like. Alternatively, it is possible to use an epoxy adhesive such as the one marketed by Alpha Metal, Inc with the trade name "442."

Figure 7:
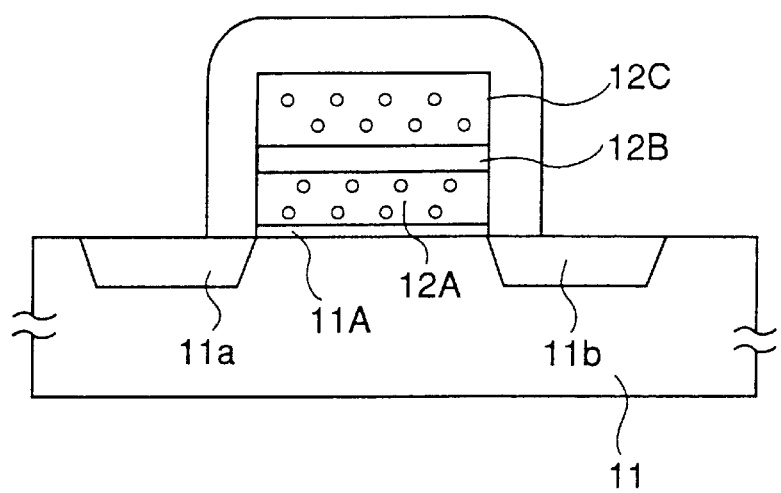
FIG. 7 is a diagram showing the construction of a conventional flash memory device.

Referring to FIG. 7, the flash memory includes a floating gate electrode 12A provided on the substrate 11 covered by a tunneling insulation film 11A such that the tunneling insulation film 11A is intervening between the substrate 11 and the floating gate electrode 12A, and a control gate electrode 12C is further provided on the floating gate electrode 12A with an insulation film 12B intervening between the floating gate electrode 12A and the control gate electrode 12C. Further, a source region 11a and a drain region 11b are formed in the substrate 11 at both sides of a channel region formed in the substrate 11 immediately underneath the floating gate electrode 12A.

In operation, the flash memory of FIG. 7 is written with information by applying a voltage across the source region 11a and the drain region 11b and further by applying a positive voltage to the control electrode 12C. Thereby, the electrons accelerated in the channel region between the source and drain regions 11a and 11b are injected to the floating gate electrode 12A through the tunneling insulation film 11A in the form of hot electrons. The electrons thus injected to the floating gate electrode 12A are held stably therein and modifies the threshold voltage of the device. It should be noted that all of the flash memory devices on the substrate 11 are already written with initial information in the respective floating gates 12A in the state of FIG. 2.

Next, the substrate 11 is ground by applying the grinding wheel 17 thereto in a step S12 of FIG. 6 similarly to FIG. 3, and the thickness of the substrate 11 is reduced to a predetermined thickness such as 530 μm.

Figure 8:
FIG. 8 is a diagram showing the semiconductor device in a step of the fabrication process of FIG. 6.
Figure 8:
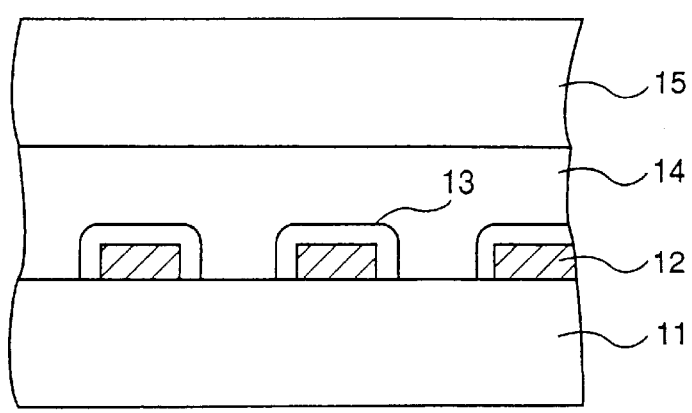

Next, in a step S13 of FIG. 6, an ultraviolet radiation of a 365 nm wavelength is applied to the adhesive layer 14 through the tape 15 from a direction opposite to the substrate 11 with a limited dose of 20 mJ/cm² or more, typically with a dose of about 50 mJ/cm² as indicated in FIG. 8, such that the adhesive layer 14 is cured partially as a result of the limited UV-radiation. As long as the radiation dose is limited below the level noted above, the majority of the electrons in the floating gate electrode 12A are free from excitation, and the problem of destruction of the initial data in the floating gate electrode 12A is successfully avoided.

Figure 9:
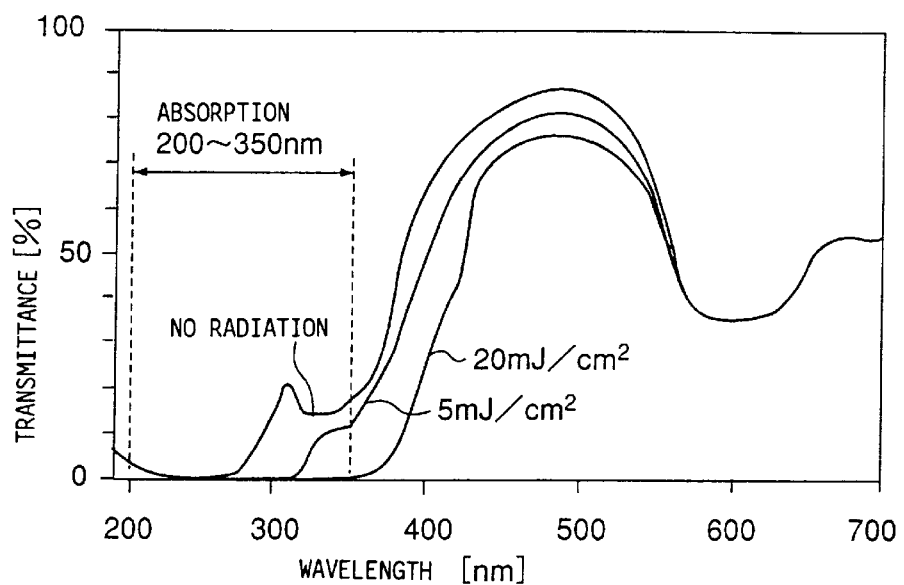
FIG. 9 is a diagram showing the characteristic of a ultraviolet filter formed in a step of a fabrication process of FIG. 6.

On the other hand, such a limited UV radiation induces a change in the transmittance of the adhesive layer 14 particularly in the wavelength range between 200–300 nm as shown in FIG. 9.

Referring to FIG. 9, the transmittance of the adhesive layer 14 decreases with increasing dose of the UV radiation, particularly in the wavelength range between 200–350 nm. In other words, such a limited UV-radiation, typically with a flux or dose of 50 mJ/cm² or less, induces a formation of an effective UV-cut filter in the adhesive layer 14.

By applying a further dose of UV-radiation to the adhesive layer 14 while using the adhesive layer 14 as a UV-cut filter, it is possible to cure the adhesive layer 14 without causing an excitation of the electrons in the floating gate 12A.

Figure 10:
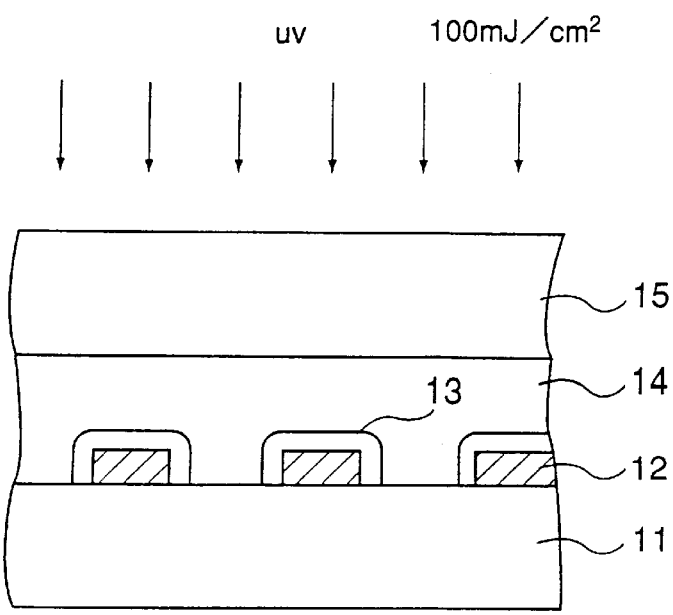
FIG. 10 is a diagram showing the semiconductor device in a further step of the fabrication process of FIG. 6.

Thus, as indicated in a step S14 of FIG. 6 as well as in FIG. 10, the adhesive layer 14 is exposed to the UV radiation of the 365 nm wavelength with a dose of about 100 mJ/cm² or less, such that the adhesive layer 14 is cured completely. As noted above, the destruction or modification of the initial data in the floating gate electrode 12C does not occur due to the UV-cut filter formed in the adhesive layer 14 and due to the fact that the UV radiation reaches the substrate 11 after passing through the adhesive layer 14.

When the cure of the adhesive layer 14 is thus completed, a step S15 is conducted in the flowchart of FIG. 6 in correspondence to the step S3 of FIG. 1, in which the tape 15 is peeled off from the substrate 11 together with the adhesive layer 14. As the adhesive layer 14 is already cured in the present embodiment, the peeling-off of the tape 15 in the step S15 can be carried out with a relatively small force. For example, it is possible to carry out the peeling-off step by using a relatively weak sticky tape having an adhesion force of 200 g/cm, for example. As a result of using a small force in the step S15, the risk of damaging the substrate 11 is substantially reduced.

After the step S15, it is also possible to carry out a thermal annealing process as described in the first embodiment.

It should be noted that the formation of the UV-cut filter in the adhesive layer 14 is by no means limited to the partial curing process induced by the ultraviolet radiation as described heretofore. For example, it is also possible to form a similar UV-cut filter by heating the adhesive layer 14 such that the adhesive layer 14 cures partially.

Figure 11:
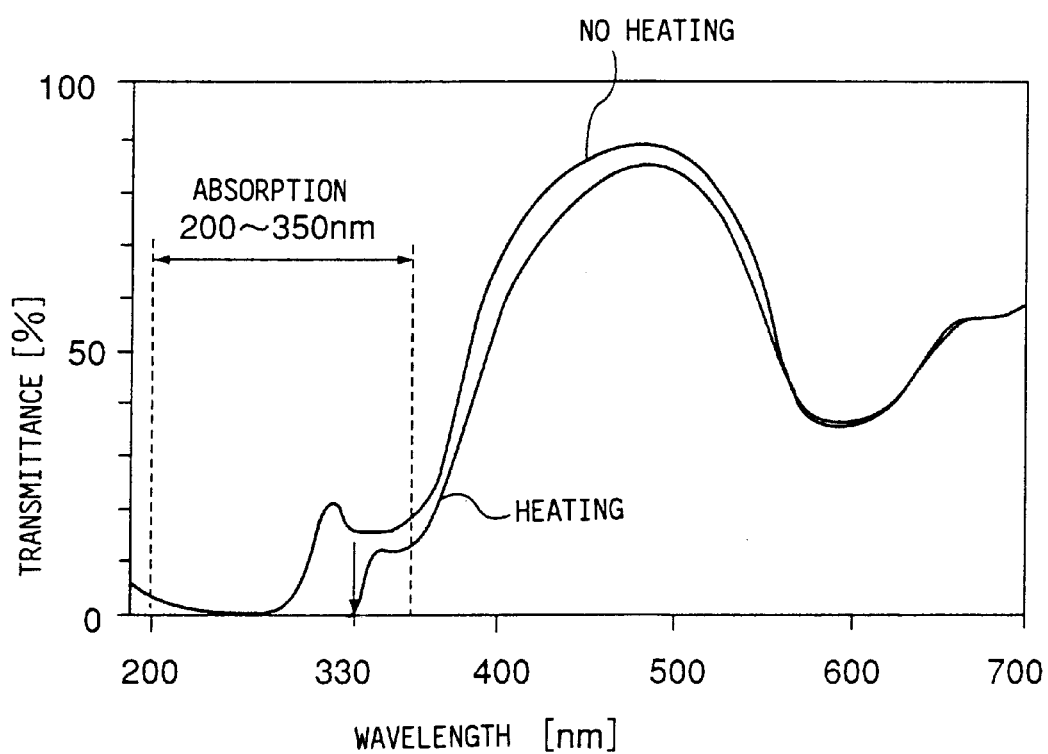
FIG. 11 is a diagram showing characteristic of a ultraviolet filter formed in a third embodiment of the present invention.

FIG. 11 shows the UV transmittance of the adhesive layer 14 according to a third embodiment of the present invention in which the adhesive layer 14, formed of an acrylic adhesive, is heated to a temperature of 60–100° C. for 1–5 seconds.

Referring to FIG. 11, it will be seen that the adhesive layer 14 thus cured partially cuts off the ultraviolet radiation having the wavelength of 330 nm or less almost completely. Thus, the third embodiment of the present invention replaces the step S13 of FIG. 6 with a step of heating the structure of FIG. 8 to the temperature fo 60–100° C. for 1–5 seconds.

Further, it is possible to use an epoxy adhesive for the adhesive layer 14 in place of an acrylic adhesive.

When using an epoxy adhesive for the adhesive layer 14, it is preferable to apply a far-ultraviolet radiation having a wavelength of 253.7 nm with a dose of 1000 mW/cm² for causing the desired partial curing, followed by a ultraviolet radiation of the same wavelength with a dose of 15000 mW/cm² or less for causing the complete curing.

Further, the present invention is not limited to the embodiments described heretofore, but various variations and modifications may be made without departing from the scope of the invention.

What is claimed is:

1. A method of fabricating a semiconductor device, comprising the steps of:

protecting a front surface of a semiconductor substrate by an adhesive medium;

grinding a rear surface of said semiconductor substrate in a state that said front surface is protected by said adhesive medium;

removing said adhesive medium from said front surface; and heating said semiconductor substrate, after said step of removing, to a temperature higher than a thermal decomposition temperature of an adhesive provided on said adhesive medium.

2. A method as claimed in claim 1, wherein said heating step is conducted at a temperature lower than a temperature above which said semiconductor device experiences a deterioration.

3. A method as claimed in claim 1, wherein said heating step is conducted at a temperature of 200° C. or more but not exceeding 350° C.

4. A method as claimed in claim 1, wherein said heating step is conducted at a temperature of 250° C. or more.

5. A method as claimed in claim 1, wherein said heating step is conducted in an inert atmosphere.

6. A method as claimed in claim 1, wherein said heating step is conducted in an oxidizing atmosphere.

* * * * *